United States Patent [19]
Furusawa et al.

[11] Patent Number: 5,421,406
[45] Date of Patent: Jun. 6, 1995

[54] HEAT SINKS HAVING PIN-SHAPED FINS AND PROCESS FOR PRODUCING SAME

[75] Inventors: Akira Furusawa; Tomio Ito, both of Tochigi; Takashi Kiyosue, Ibaraki; Yoshifumi Shimajiri, Tochigi, all of Japan

[73] Assignee: Showa Aluminum Corporation, Sakai, Japan

[21] Appl. No.: 77,068

[22] Filed: Jun. 16, 1993

[30] Foreign Application Priority Data

Jun. 16, 1992 [JP] Japan .................................. 4-157071

[51] Int. Cl.$^6$ ............................................. H05K 7/20
[52] U.S. Cl. .................... 165/185; 174/16.3; 361/703
[58] Field of Search ................ 165/185; 174/16.3; 361/690, 697, 703

[56] References Cited

U.S. PATENT DOCUMENTS

| | | | |
|---|---|---|---|
| 3,193,003 | 7/1965 | McCuen | 165/80.3 X |
| 4,823,869 | 4/1989 | Arnold et al. | 174/16.3 X |
| 4,884,331 | 12/1989 | Hinshaw | 165/185 X |

FOREIGN PATENT DOCUMENTS

| | | | |
|---|---|---|---|
| 485205 | 5/1992 | European Pat. Off. | 174/16.3 |
| 60-86780 | 6/1985 | Japan . | |
| 60-105975 | 7/1985 | Japan . | |
| 63-2788 | 1/1988 | Japan . | |

*Primary Examiner*—Stephen M. Hepperle
*Attorney, Agent, or Firm*—Armstrong, Westerman, Hattori, McLeland & Naughton

[57] ABSTRACT

A heat sink having pin-shaped fins, for example, for use in disposing of heat in printed boards for computers comprises a heat dissipating base plate and a plurality of comblike fin members arranged in parallel at a predetermined spacing on one surface of the base plate approximately perpendicular thereto, each of the fin members comprising pin-shaped fins arranged in a row and connector connecting the fins together each at one end thereof, the connector of each fin member being joined to the surface of the base plate. The fins are given a greater height and arranged with a reduced pitch with a higher density for disposal of increased amounts of heat. To prepare the heat sink, the fin members are blanked out from a metal sheet, the fin members and spacer plates are arranged alternately on one surface of a heat dissipating base plate approximately perpendicular thereto, the connectors of the fin members are joined to the base plate and the spacer plates are thereafter removed. A comblike fin member having pin-shaped fins and a large length is bent to a zigzag form when seen from above.

2 Claims, 8 Drawing Sheets

HEAT SINKS HAVING PIN-SHAPED FINS AND PROCESS FOR PRODUCING SAME

BACKGROUND OF THE INVENTION

The present invention relates to heat sinks comprising pin-shaped fins, for example, for use in disposing of heat in printed wiring boards for computers, and to a process for producing the same.

Heat sinks having pin-shaped fins are used in recent years to meet the need to dissipate larger amounts of heat in printed wiring boards of increased complexities and higher performance for Computers. Such heat sinks having pin shaped fins are prepared usually by cold forging.

However, conventional heat sinks comprising pin-shaped fins and produced by cold forging have the problem of being limited to about 4 mm in the height of fins and to about 3 mm in fin pitch, so that it has been strongly desired to provide heat sinks having pin-shaped fine of higher density in order to provide greater heat dissipating capacity).

SUMMARY OF THE INVENTION

The main object of the present invention is to provide a heat sink comprising pin-shaped fins free of the above problem, and a process for producing the heat sink.

The present invention provides a heat sink which is characterized in that the heat sink comprises a heat dissipating base plate and a plurality of comblike fin members arranged in parallel at a predetermined spacing on one surface of the base plate and positioned approximately perpendicular thereto, each of the fin members comprising pin-shaped fins arranged in a row and a connector connecting the fins together each at one end thereof, the connector of each fin member being joined to the surface of the base plate.

In addition to the connector for connecting the row of pin-shaped fins together each at one end thereof, the comblike fin member may further have an intermediate connecting portion connecting the fins together each at an intermediate portion of the height thereof.

When the connector of each fin member is provided on at least one of opposite sides thereof with a projecting spacer portion, the fin members are arranged in parallel as spaced apart by the spacer portion between adjacent fin members.

The comblike fin member may be elongated. In this case, the elongated fin member is placed as bent to a zigzag form when seen from above on one surface of the base plate, and the connector of the zigzag fin member is joined to the surface of the base plate.

In the case where the connector of the elongated comblike fin member is provided on each of opposite sides thereof with a projecting spacer portion, cutouts are formed in the spacer portion at a predetermined spacing. The fin member is bent at the portions of the connector corresponding to the respective cutouts in the spacer portion into a zigzag form when seen from above. The zigzag fin member then has straight connector portions adjacent to each other and arranged in parallel as spaced apart by the spacer portions According to an embodiment of the invention, the heat sink has no heat dissipating base plate. In this case, the comblike fin member comprises pin-shaped fins arranged in a row, a connector connecting the fine together each at its one end and a projecting spacer portion provided on at least one of opposite sides of the connector. The fin members are arranged in parallel as spaced apart by the spacer portion between adjacent fin members. The adjacent fin members are joined together between a side face of the connector and a side face of the spacer portion or between opposed side faces of their spacer portions.

When the comblike fin member is an elongated member in the absence of the base plate, the projecting spacer portion is provided on each of opposite sides of the connector of the fin member and has cutouts at a predetermined spacing. The fin member is bent at the portions of the connector corresponding to the respective cutouts in the spacer portion into a zigzag form when seen from above. The zigzag fin member has straight connector portions adjacent to each other and arranged in parallel as spaced apart by the spacer portions, the adjacent straight connector portions being joined together between opposed side faces of their spacer portions.

The present invention provides a process for producing a heat sink which is characterized in that the process comprises the step of blanking out from a fin-forming metal sheet a required number of comblike fin members each comprising pin-shaped fins arranged in a row and a connector connecting the fins together each at its one end, the step of arranging the fin members in parallel on one surface of a heat dissipating base plate approximately perpendicular thereto with a spacer plate interposed between adjacent fin members, the step of joining the connectors of the fin members to the surface of the base plate, and the step of withdrawing the spacer plate from between the adjacent fin members.

In the case where the projecting spacer portion is provided on at least one of opposite sides of the connector of each comblike fin member, the spacer plate need not be used. In this case, a fin-forming extruded material is prepared which comprises a sheet portion, and a projecting spacer portion formed on at least one of opposite sides of a side edge of the sheet portion. The sheet portion of the material is punched to prepare comblike fin members each comprising pin-shaped fine arranged in a row, a connector connecting the fins together each at its one end and a projecting spacer portion on at least one of opposite sides of the connector. A required number of fin members are arranged in parallel on one surface of a heat dissipating base plate approximately perpendicular thereto while being held spaced apart from one another by the respective spacer portions. The connectors and the spacer portions of the fin members are joined to the surface of the base plate.

In the case where the comblike fin member is an elongated member, the heat sink is produced by blanking out from an elongated fin-forming metal sheet an elongated comblike fin member comprising pin-shaped fins arranged in a row and a connector connecting the fins together each at its one end, placing the fin member as bent to a zigzag from when seen from above on one surface of a heat dissipating base plate approximately perpendicular thereto with a spacer plate interposed between adjacent straight portions of the zigzag fin member, joining the connector of the zigzag fin member to the surface of the base plate, and withdrawing the spacer plate from between the adjacent straight portions of the fin member.

Similarly when the comblike fin member is an elongated member and has a projecting spacer portion on each of opposite sides of its connector, there is no need to use the spacer plate. In this case, a fin-forming extruded material of large length is prepared which comprises a sheet portion, and a projecting spacer portion formed on each of opposite sides of a side edge of the sheet portion. The sheet portion is punched to form an elongated comblike fin member comprising pin-shaped fins arranged in a row, a connector connecting the fins together each at its one end and a projecting spacer portion on each of opposite sides of the connector. Cutouts are formed in the spacer portion at a predetermined spacing, and the fin member is bent at the portions of the connector corresponding to the respective cutouts in the spacer portion into a zigzag form when seen from above. The zigzag fin member is placed on a heat dissipating base plate, and the connector and the spacer portions of the member are joined to the base plate.

According to an aspect of the invention, the heat sink has no heat dissipating base plate. The heat sink is then prepared from a fin-forming extruded material having a sheet portion. The sheet portion is punched to form comblike fin members each comprising pin-shaped fins arranged in a row, a connector connecting the fins together each at one end thereof and a projecting spacer portion on at least one of opposite sides of the connector. A required number of fin members are arranged in parallel as held spaced apart from one another by the spacer portions, and the adjacent fin members are connected together by a joint between a side face of the connector and a side face of the spacer portion or between opposed side faces of their spacer portions.

In the case where the comblike fin member is an elongated member similarly in the absence of the heat dissipating base plate, a fin-forming extruded material of increased length is prepared which comprises a sheet portion, and a projecting spacer portion formed on each of opposite sides of a side edge of the sheet portion. The sheet portion is punched to form an elongated comblike fin member comprising pin-shaped fins arranged in a row, a connector connecting the fins together each at is one end and a projecting spacer portion on each of opposite sides of the connector. Cutouts are formed in the spacer portion at a predetermined spacing, and the fin member is bent at the portions of the connector corresponding to the respective cutouts in the spacer portion into a zigzag form when seen from above. The zigzag fin member has adjacent straight connector portions, which are connected together by a joint formed between opposed side faces of their spacer portions.

The heat dissipating base plates described above are made of a metal such as aluminum (including aluminum alloys) or copper (inclusive of alloys thereof) and are, for example, 10 to 150 mm in length, 10 to 150 mm in width and 1 to 5 mm in thickness.

Similarly, the pin-forming metal sheets are made of a metal such as aluminum or copper (including alloys of such metals), and measure, for example, 10 to 150 mm in length and 0.3 to 1 mm in thickness. To obtain pin-shaped fins having a height of at least 5 mm, the metal sheet is at least 5 mm, preferably 5 to 80 mm, in width (height).

The comblike fin member comprising pin-shaped fins arranged in a row and a connector connecting these fins together each at its one end is blanked out from such a fin-forming metal sheet. The pin-shaped fins thus blanked out are square to rectangular in cross section and 0.3 to 1 mm in the length of one side of the cross section. The fin pitch is, for example, 0.9 to 2.5 mm.

Generally it is desirable to make the blanking-out width equal to the thickness of the metal sheet and to blank out fins of square cross section.

The connector connecting all the pin-shaped fins together each at its one end has a width, for example, of 0.1 to 1 mm.

The spacer plates to be arranged alternately with fin members are made, for example, of stainless steel. Preferably, the spacer plates have a height approximately equal to the height of fin members and a thickness equal to the fin pitch, i.e., to the length of one side of the fin. The length of the spacer plates is preferably greater than the length of fin members so as to be readily removable after the assembly.

The connector of the comblike fin member is joined to one surface of the heat dissipating base plate by brazing or adhesion. When the base plate is made of aluminum, it is desirable to use an aluminum brazing sheet or a filler metal sheet for aluminum bare material.

When a heat-treated alloy is used for the fin-forming metal sheet, an ageing treatment following brazing affords an improved strength.

In the case where the fin-forming metal sheet is in the form of a flat sheet of large length, it is preferable to use a coiled material of metal such as aluminum or copper (or alloy of such metal). The coiled material is, for example, 5 to 80 mm in width and 0.3 to 1 mm in thickness and has a length which is suitably determined (by cutting) in accordance with the number of straight portions to be obtained by blaking out the fin member from the material and bending the member zigzag.

When the elongated comblike fin member is bent to a zigzag form as seen from above, a spacer plate is interposed between adjacent straight portions of the zigzag fin member, The spacer plate may be the same as those described above.

The heat dissipating base plate may be formed in one surface thereof with a groove extending over the entire length thereof for the connector of the fin member to fit in. In this case, the spacer plate need not be used.

A fin-forming extruded material is used when the projecting spacer portion is to be provided on the connector of the comblike fin member. Like the fin-forming metal sheet, the fin-forming extruded material is made of a metal such as aluminum, copper or an alloy thereof and has a length, for example, of 10 to 150 mm. The sheet portion of this extruded material is 0.3 to 1 mm in thickness and has a height of at least 5 mm, preferably 5 to 25 mm, so as to obtain pin-shaped fins having a height of at least 5 mm.

Preferably, the projecting spacer portion of the fin-forming extruded material is provided on each of opposite sides of one side edge of the sheet portion, whereas the spacer portion may be formed on one of the opposite sides.

The height of the spacer portion, i.e., the width of the connector, is generally, for example, 0.5 to 1 mm. The height of the spacer portion can of course be different from the width of the connector.

In the case where the spacer portion is provided on each of opposite sides of side edge of the sheet portion, the width of the spacer portion itself corresponds to one-half of the spacing between the fin members. When it is provided on one side, the width is equal to the spacing.

When the fin members are arranged on one surface of the heat dissipating base plate, the adjacent members are held spaced apart by the projecting spacer portion. This eliminates the need for the spacer plate.

In the case where the fin member is elongated and has the projecting spacer portion on each side of the connector of the fin member, the elongated fin member is bent to a zigzag form when seen from above. At the position of each bend to be formed, the spacer portion on each side of the fin member is formed with a cutout of required width. The width of the spacer portion on each side is one-half of the spacing between the straight fin members portions providing the zigzag arrangement.

With the process of the invention for producing heat sinks, pin-shaped fins are blanked out in a comblike pattern from a metal sheet. The width (height) of the metal sheet itself other than the portion thereof providing the fin connector is therefore equal to the height of the pin-shaped fins produced. Furthermore, the fin blanking-out pitch or the thickness of spacer plates used on the base plate becomes the fin pitch.

With the process of the invention, therefore, the pin-shaped fins of the heat sink can be given a great height and can be arranged very closely, that is, with a high density.

Especially, the pin-shaped fins blanked out are square to rectangular in cross section and have angles or corners, which effectively act to disturb air currents to exhibit improved performance.

When an aluminum coiled material or like elongated fin-forming metal sheet is used, an elongated comblike fin member is continuously blanked out from the coiled material and thereafter bent to a zigzag form as seen from above, and spacer plates are interposed between straight portions of metal sheet. This ensures efficient work and high productivity. The width (height) of the metal sheet (other than the fin connector) becomes the height of the fins obtained, and the fin blanking pitch and the thickness of the spacer plates become the fin pitch, so that the fins can be given a very great height and can be arranged very closely.

In the case where pin-shaped fins are blanked out from the sheet portion of the fin-forming extruded material, the width (height) of the sheet portion becomes the height of the fins produced, and the fin blanking-out pitch and the combined width of the spacer portions between the portions of extruded material become the fin pitch. This increases the height of pin-shaped fins and reduces the fin pitch. Moreover, the spacer portion on the fin-forming extruded material eliminates the need to use the spacer plate to result in facilitated work and high productivity.

After the elongated fin member is continuously blanked out from the sheet portion of the elongated fin-forming extruded material, the projecting spacer portion is cut out at required locations, and the fin member is bent to a zigzag form when seen from above. This process assures efficient work and high productivity and reduces the fin pitch similarly and obviates the need to use the spacer plate.

Further, even when pin-shaped fins are blanked out from the sheet portion of the extruded material, the fins obtained are square to rectangular in cross section and therefore have corners or angles, which effectively produce turbulence in air streams to result in improved performance.

The present invention will be described in greater detail with reference to the accompanying drawings.

BRIEF DESCRIPTION OF THE DRAWINGS

FIG. 2 to FIG. 6 are Views for illustrating stepwise a process for producing the pin-shaped fins according to the first embodiment of the invention, FIG. 2 being a perspective view of a comblike fin member having pin-shaped fins;

DESCRIPTION OF THE PREFERRED EMBODIMENTS

Throughout the drawings, like parts are designated by like reference numerals.

Figure 1:
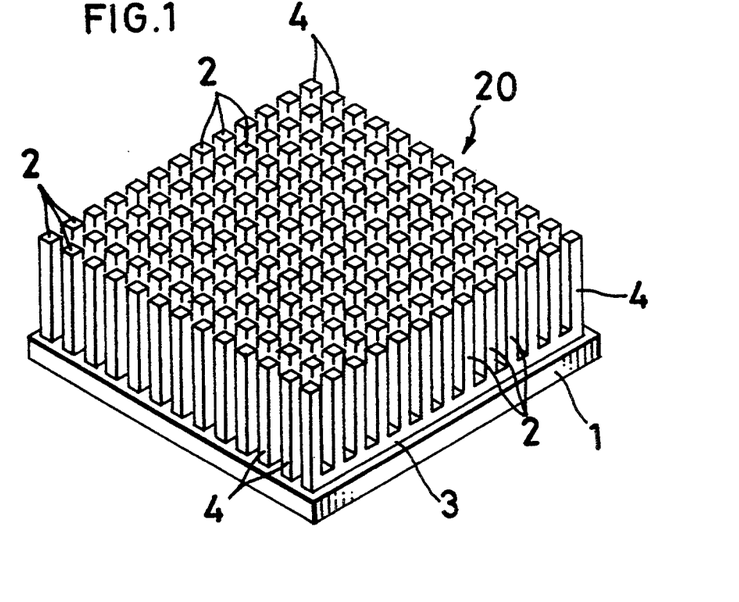
FIG. 1 is a perspective view of a first embodiment of the invention, i.e., a heat sink comprising pin-shaped fins.

FIG. 1 shows a first embodiment of the present invention, i.e., a heat sink 20, which comprises a heat dissipating base plate 1 and a multiplicity of comblike fin members 4 arranged in parallel at a predetermined spacing on one surface of the base plate 1 and positioned approximately perpendicular to the base plate 1. Each of the fin members 4 comprises pin-shaped fins 2 arranged in a row and a connector 3 connecting the fins 2 together each at one end thereof. The connector 3 of each fin member 4 is joined to the surface of the base plate 1.

The heat sink 20 of the first embodiment of the invention is produced by the process to be described below stepwise with reference to FIGS. 2 to 6.

First Step

Figure 2:
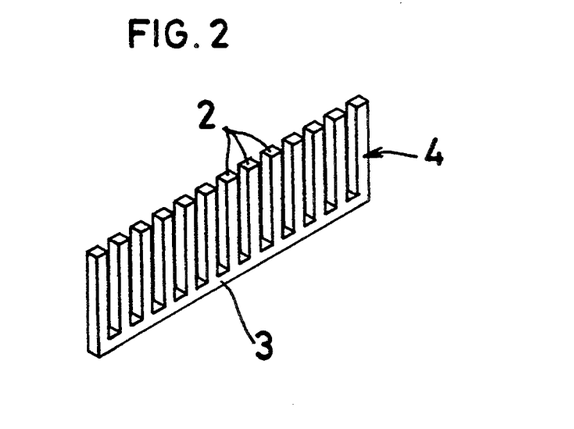
Figure 3:
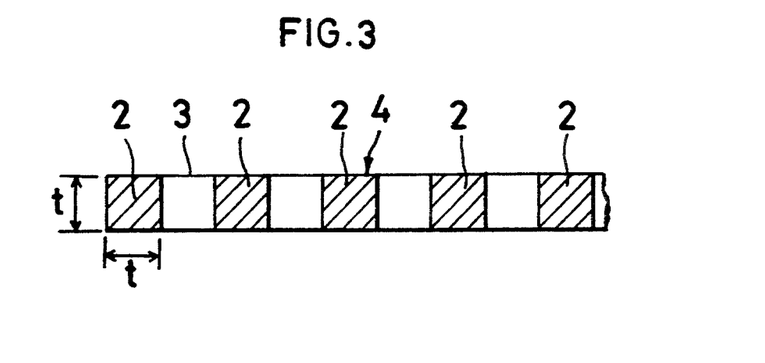
FIG. 3 is an enlarged fragmentary view in horizontal section of the fin member.

The comblike fin member 4 comprising pin-shaped fins 2 arranged in a row and a connector 3 connecting the fins together each at its one end was blanked out from a fin-forming metal sheet.

The fin-forming metal sheet used was a coiled sheet of aluminum alloy (A6063) having a thickness t of 0.5 mm. The fin-forming aluminum sheet was 25 mm in width so as to give the pin-shaped fins 2 a height of 20 mm and the connector 3 a height of 0.5 mm.

The fin blanking-out pitch was equal to the thickness t of the aluminum sheet, i.e., 0.5 mm. The fins 2 formed had a square cross section which was 0.5 mm in the length of each side (see FIGS. 2 and 3).

Second Step

The heat dissipating base plate 1 used was an aluminum brazing sheet having a filler metal layer and measuring 60 mm in length, 60 mm in width and 1.6 mm in thickness. A multiplicity of comblike fin members 4 were arranged in parallel on one surface of the base plate 1 provided by the filler metal layer approximately perpendicular to the plate 1 for setting, with spacer plates 11 interposed between the members 4 (see FIG. 4).

Figure 4:
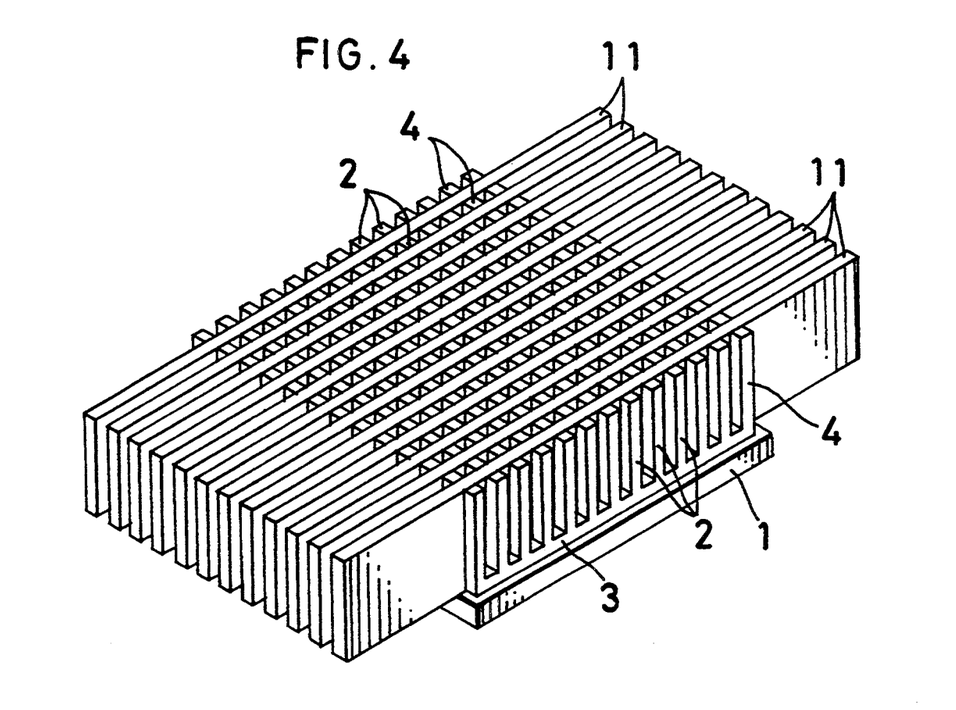
FIG. 4 is a perspective view schematically showing comblike fin members and spacer plates arranged alternately as set in position on one surface of a heat dissipating base plate.

The spacer plates 11 were 80 mm in length and 0.6 mm in thickness and made of stainless steel. The width (height) of the spacer plates 11, which was 20 mm, was equal to the height of the fin members 4.

Third Step

The components of the heat sink as completely set were held between two upper and lower brazing holder plates 5, 5 of stainless steel. The whole assembly was fastened with four spring clips 6 and placed into the oven of a vacuum brazing device, whereby the connectors 3 of the fin members 4 were joined over the entire length thereof to the surface of the base plate 1 having the filler metal (see FIG. 5).

Fourth Step

After brazing, the upper and lower holder plates 5, 5 and the spring clips 6 were removed, and the spacer plates 11 were withdrawn from between the fin members 4 (see FIG. 4), whereby a heat sink 20 was produced which had a multiplicity of pin-shaped fins 2 on the surface of the base plate 1 (see FIG. 1).

With the process described, the fins 2 are blanked out in a comblike pattern from an aluminum sheet, so that the width (height) of the aluminum sheet itself except for the portion thereof providing the fin connector 3 becomes the height of the pin-shaped fins 2 prepared, and the fin blanking-out pitch or the thickness of the spacer plate 11 becomes the fin pitch. The fins 2 of the heat sink 20 can therefore be given a very great height and arranged with a reduced pitch, i.e., with a high density.

Figure 7:
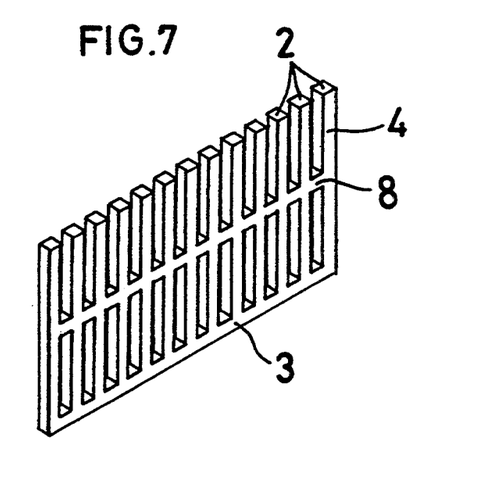
FIG. 7 is a perspective view showing a modified comblike fin member having pin-shaped fins.

FIG. 7 shows a modified comblike fin member 4. The modification differs from the fin member of the first embodiment shown in FIG. 2 in that in addition to the connector 3 connecting the row of fins 2 together each at its one end, the fin member 4 also has an intermediate connecting portion 8 connecting the fins 2 together at an intermediate portion of the height thereof. Provision of the intermediate connecting portion 8 imparts an increased strength to the fin member 4, consequently resulting in the advantage that the pin-shaped fins 2 can be made still higher.

FIG. 8 shows a modified process for forming the fin member 4.

Figures 8A, 8B, 8C:
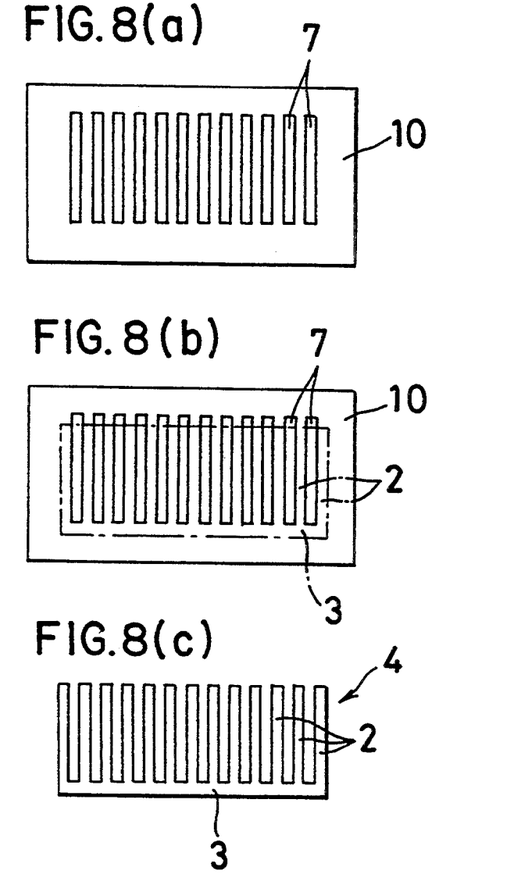
FIG. 8 includes schematic plan views showing stepwise another process for producing a comblike fin member having pin-shaped fins.

First, parallel slits 7 are punched in a rectangular fin-forming metal sheet 10 to shape the metal sheet 10 to the form of a lattice (see FIG. 8, (a)).

Next, a portion is blanked out from the metal sheet 10 such that the upper end of the slitted portion is cut while leaving a connector 3 of required width by cutting the sheet 10 at a position a small distance downwardly away from the lower ends of the slits 7 (see FIG. 8, (b)). The comblike fin member 4 thus formed comprises pin-shaped fins 2 arranged in a row and a connector 3 connecting the fins together each at its one end (see FIG. 8, (c)).

Figure 9:
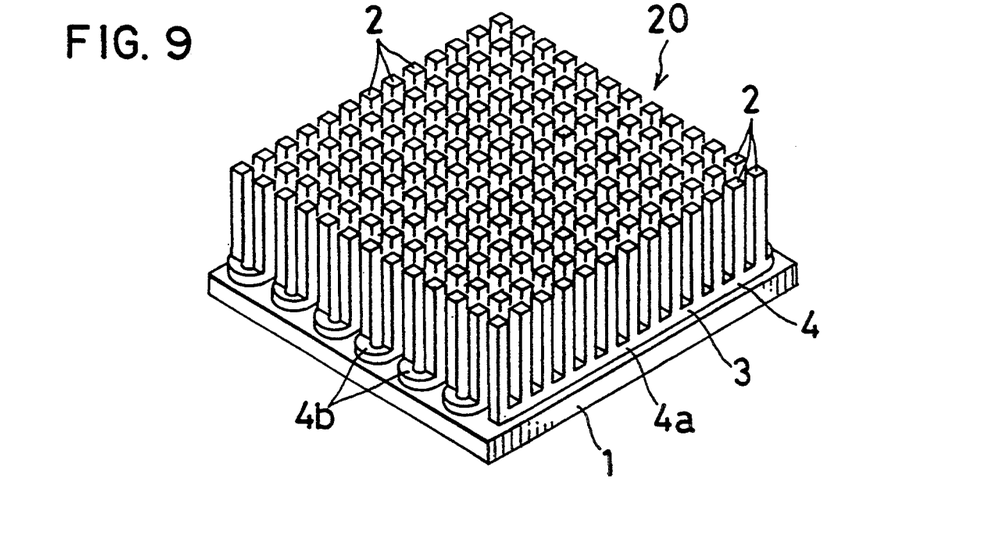
FIG. 9 is a perspective view showing a heat sink having pin-shaped fins as a second embodiment of the invention.

FIG. 9 shows a second embodiment of the invention, i.e., another heat sink 20. With reference to this drawing, the heat sink of the second embodiment comprises an elongated comblike fin member 4 which is placed, as bent to a zigzag form when seen from above, on one surface of a heat dissipating base plate 1. The zigzag fin member 4 has straight portions 4a which are arranged in parallel at a predetermined spacing, and includes a connector 3 which is joined over the entire length thereof to the surface of the base plate 1. FIG. 9 shows that one fin 2 is cut away from each bend 4b of the zigzag fin member 4, whereas the pin 2 may of course remain unremoved from the bend.

To prepare the heat sink 20, the elongated fin member 4 comprising pin-shaped fins 2 in a row and a connector 3 connecting the fins 2 each at its one end is bent to a zigzag form when seen from above, then placed on and joined to one surface of the base plate 1.

In preparing the heat sink 20 of the second embodiment, the elongated fin member 4 of the structure described above is blanked out from an elongated fin-forming metal sheet although not shown in detail. The elongated fin member 4 is placed as bent zigzag when seen from above on the surface of the base plate 1 provided by a filler metal layer, is positioned approximately perpendicular to the base plate 1 with a spacer plate 11 like those shown in FIG. 4 interposed between adjacent straight portions of the member 4 and is set in place.

Figure 5:
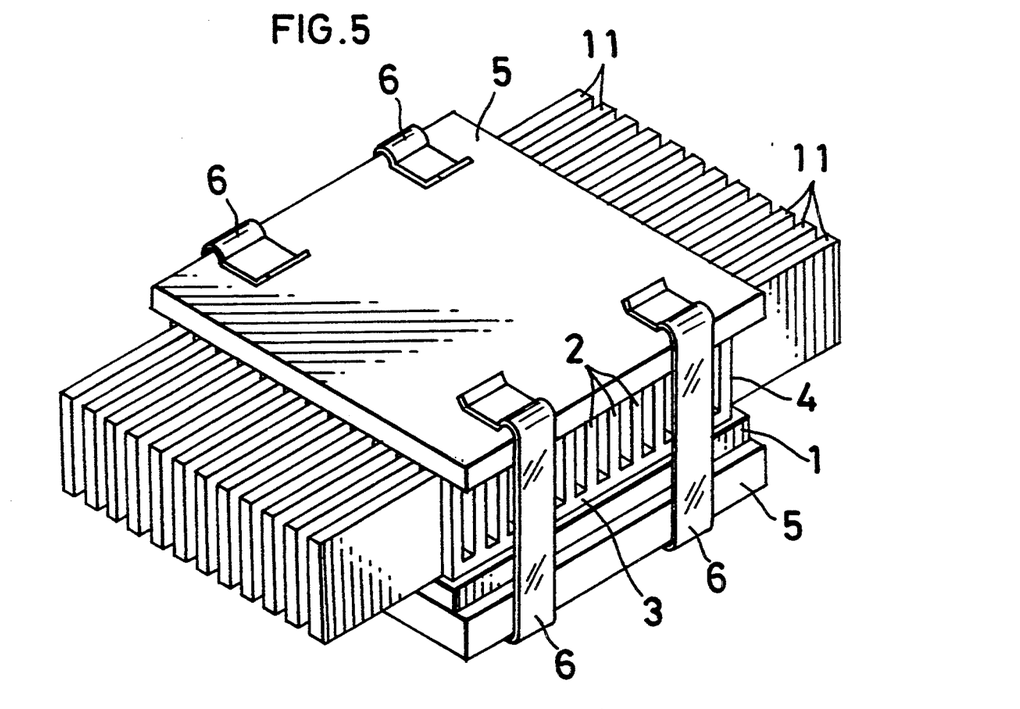
FIG. 5 is a perspective view schematically showing the components of the heat sink as set in position, with brazing holder plates placed on the top and bottom sides and fastened with spring clips.
Figure 6:
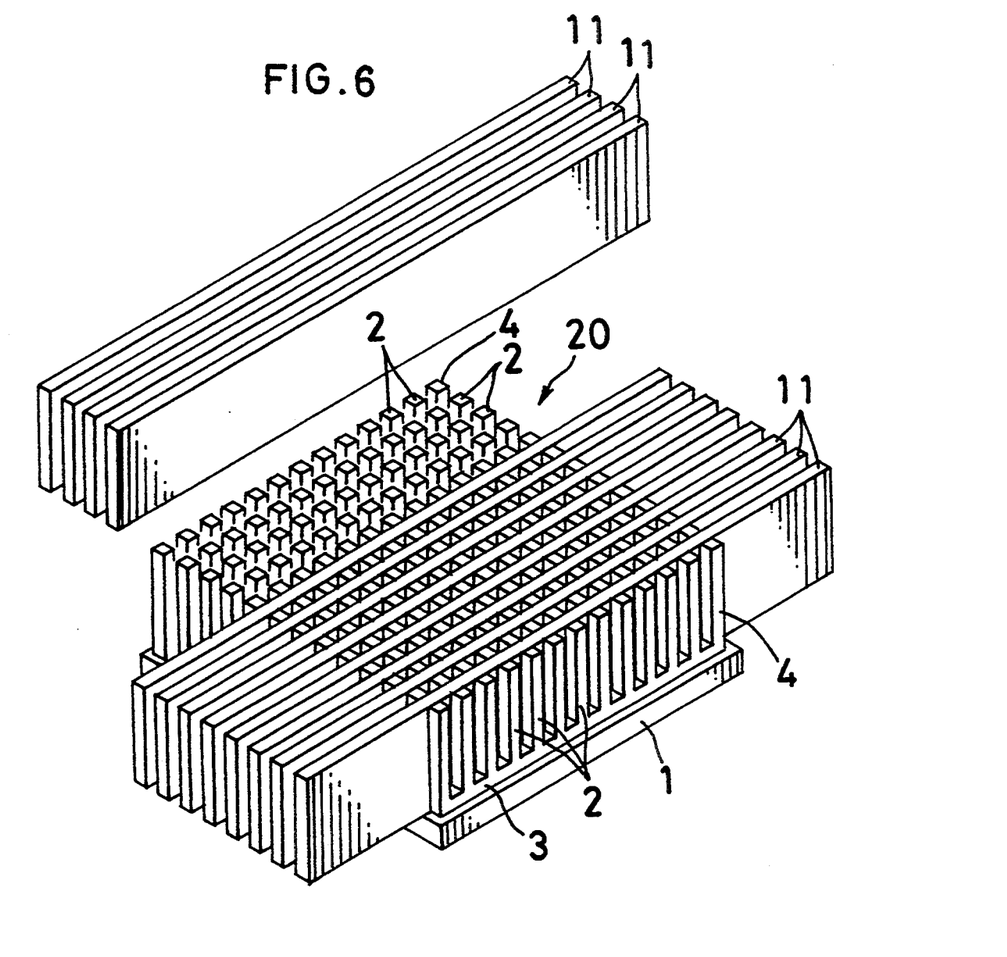
FIG. 6 is a perspective view showing the same with some of spacer plates removed from between pin-shaped fins formed.

The sink components completely set are then held between upper and lower two brazing holder plates 5, 5 like those shown in FIG. 5, the whole assembly is fastened with spring clips 6 and placed into the oven of a vacuum brazing device, and the connector 3 of the zigzag fin member 4 is joined over the entire length thereof to the surface of the base plate 1 having a filler metal layer.

After brazing, the upper and lower holder plates 5, 5 and the spring clips 6 are removed, and the spacer plates 11 are removed from between adjacent straight portions 4a, 4a of the zigzag fin member 4, whereby a heat sink 20 is produced which has a multiplicity of pin-shaped fins 2 on one surface of the heat dissipating base plate 1 (see FIG. 9).

Figure 10:
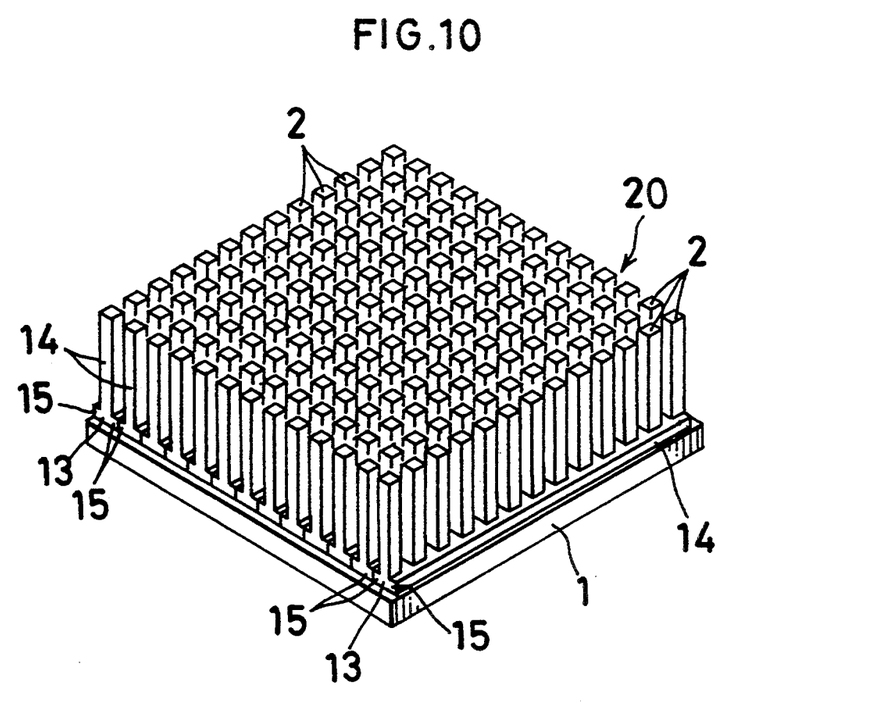
FIG. 10 is a perspective view of a heat sink having pin-shaped fins as a third embodiment of the invention.

FIG. 10 shows a heat sink 20 according to a third embodiment of the invention. The heat sink 20 comprises comblike fin members 14 each having projecting spacer portions 15, 15 on the respective opposite sides of its connector 3. The fin member 14 is generally inverted T-shaped in cross section. The fin members 14 are arranged in parallel as held spaced apart from one another by the spacer portions 15, 15. The width of the spacer portions 15, 15 on the respective sides are one-halft of the spacing between the fin members 14.

Figure 11:
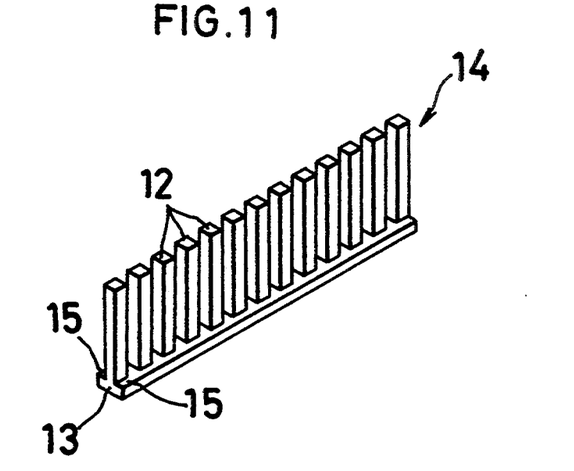
FIG. 11 is a perspective view of a comblike fin member having pin-shaped fins included in the heat sink of the third embodiment.

Although the process for producing the heat sink 20 of the third embodiment of the invention is not illustrated in detail, a fin-forming extruded material is used which comprises a sheet portion, and a projecting spacer portion formed on each of opposite sides of a side edge of the sheet portion. The fin member 14, which comprises pin-shaped fins 12 in a row, a connector 13 for connecting the fins together each at its one end and a spacer portion 15 on each of opposite sides of the connector 13, is blanked out from the sheet portion of the material (see FIG. 11).

Next, the components of the heat sink as completely set are held between upper and lower brazing holder plates 5, 5 like those shown in FIG. 5, the whole assembly is fastened with spring clips 6 and placed into the oven of a vacuum brazing device, and the connectors 13 and spacer portions 15 of such fin members 14 are joined to one surface, having a filler metal layer, of a heat dissipating base plate 1 (see FIG. 10).

Figure 14:
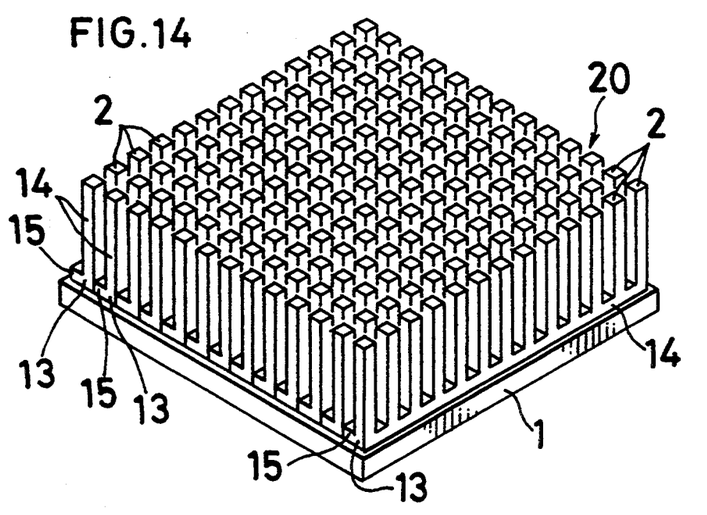
FIG. 14 is a perspective view of a heat sink having pin-shaped fins as a modification of the third embodiment.
Figure 15:
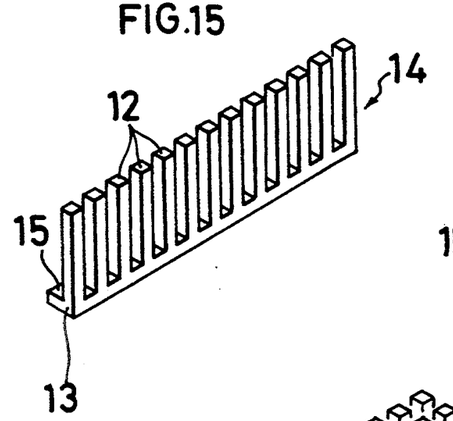
FIG. 15 is a perspective view of a comblike fin member having pin-shaped fins and constituting the modification.

FIGS. 14 and 15 show a modification. The illustrated comblike fin member 4 has a spacer portion 15 formed on one of opposite sides of a connector 13. The fin member 14 is generally L-shaped in cross section.

With the third embodiment and the modification, the spacer portion 15 on the fin member connector 13 obviates the need to use the spacer plate.

Figure 12:
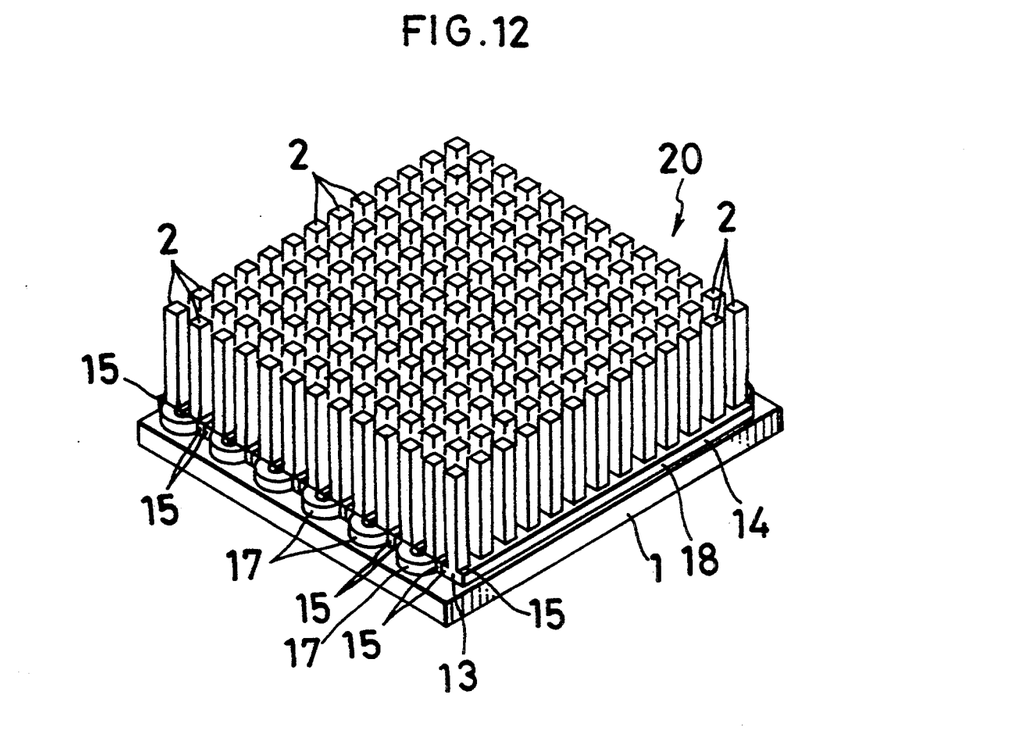
FIG. 12 is a perspective view of a heat sink having pin-shaped fins as a fourth embodiment of the invention.

FIG. 12 shows a heat sink 20 according to a fourth embodiment of the invention. With this heat sink 20, projecting spacer portions 15, 15 are provided on the respective opposite sides of connector 13 of an elongated comblike fin member 14, and cutouts 16, 16 are formed in the respective spacer portions 15, 15 at a predetermined spacing. The fin member 14 is bent at the portions 17 of the connector corresponding to the cutouts 16, 16 in the spacer portions 15, 15 into a zigzag form when seen from above, opposed side faces of the spacer portions 15, 15 of adjacent straight connector portions 18, 18 are in butting contact with each other, and the zigzag fin member 14 is placed on and joined to a heat dissipating base plate 1.

Figure 13:
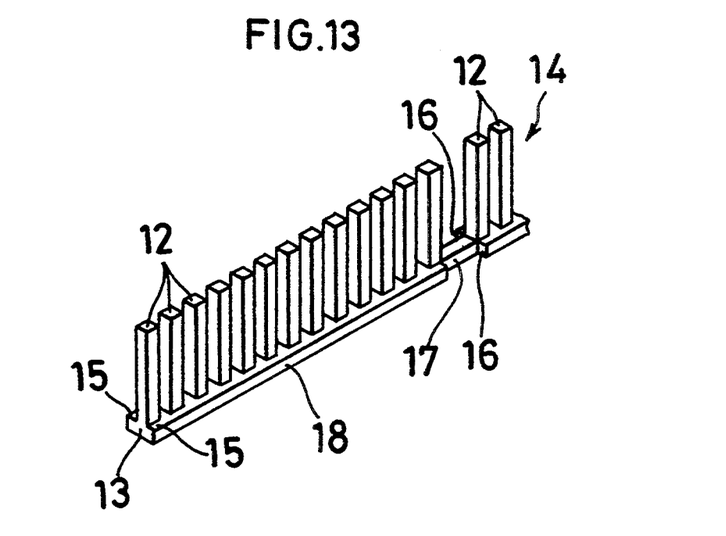
FIG. 13 is a perspective view of a comblike fin member having pin-shaped fins and constituting the heat sink of the fourth embodiment.

Although the process for producing the heat sink 20 of the fourth embodiment is not shown in detail, an elongated fin-forming extruded material is used which comprises a sheet portion, and spacer portions 15, 15 projecting from opposite sides of a side edge of the sheet portion. An elongated comblike fin member 14 comprising pin-shaped fins 12 in a row, a connector 13 connecting the fins together each at its one end and spacer portions 15, 15 on opposite sides of the connector 13 is blanked out from the sheet portion. Cutouts 16, 16 are formed in the respective spacer portions 15, 15 on the connector 13 of the fin member 14 at a predetermined spacing (see FIG. 13), the fin member 14 is bent at the portions 17 of the connector corresponding to the respective cutouts 16, 16 in the spacer portions 15, 15 into a zigzag form when seen from above, and opposed side faces of spacer portions 15, 15 of adjacent straight connector portions 18, 18 are in butting contact with each other. The zigzag fin member 14 is then placed on a heat dissipating base plate 1 for setting.

Next, the heat sink components as completely set are held between upper and lower brazing holder plates 5, 5 like those shown in FIG. 5, the whole assembly is fastened with spring clips 6 and placed into the oven of a vacuum brazing device, and the connector 13 of the zigzag fin member 14 is joined approximately over the entire length thereof to the filler metal bearing surface of the base plate 1.

Figure 16:
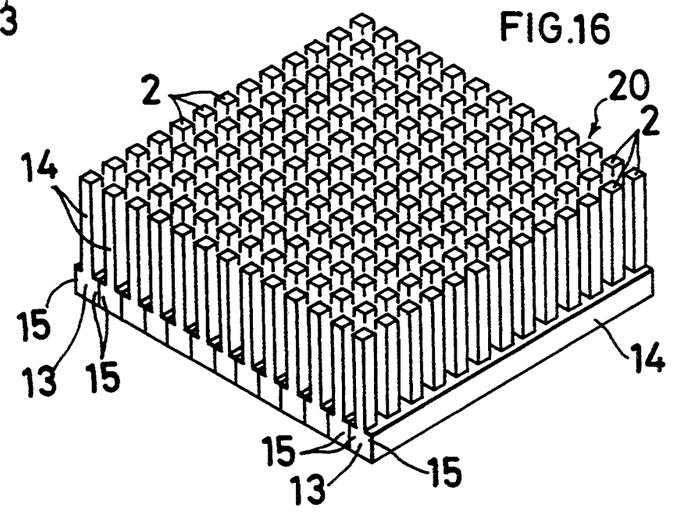
FIG. 16 is a perspective view of a heat sink having pin-shaped fins as a fifth embodiment of the invention
Figure 17:
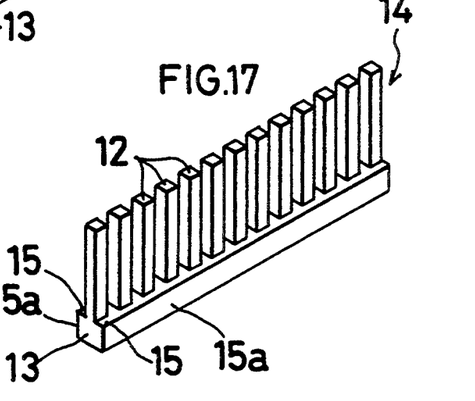
FIG. 17 is a perspective view of a comblike fin member having pin-shaped fins and constituting the heat sink of the fifth embodiment.

FIG. 16 shows a heat sink 20 according to a fifth embodiment of the invention, which has no base plate 1. The sink comprises comblike fin members 14 each including pin-shaped fins 2 in a row, a connector 13 connecting these fins together each at its one end and projecting spacer portions 15, 15 on the respective opposite sides of the connector 13 (see FIG. 17). The fin members 14 are arranged in parallel as held spaced apart from one another by the spacer portions 15, 15 between adjacent fin members. Opposed side faces 15a, 15a of the spacer portions 15, 15 of the adjacent fin members 14 are joined to each other by a filler metal layer.

Although not shown, the spacer portion 15 may be provided on one of opposite sides of the fin member connector 13 to make the fin member 14 L-shaped in cross section (see FIGS. 14 and 15). In this case, a side face of the connector 13 and a side face of the spacer portion 15 of the adjacent fin members 14 are joined to each other by a filler metal layer.

Figure 18:
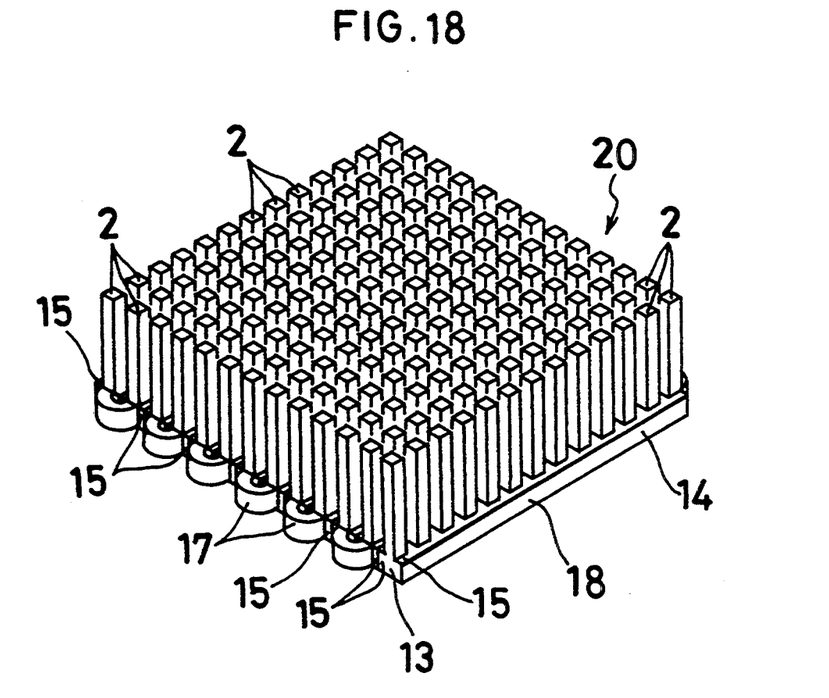
FIG. 18 is a perspective view of a heat sink having pin-shaped fins as a sixth embodiment of the invention; and FIG, 19 is a perspective view of a comblike fin member having pin-shaped fins and constituting the heat sink of the sixth embodiment.
Figure 19:
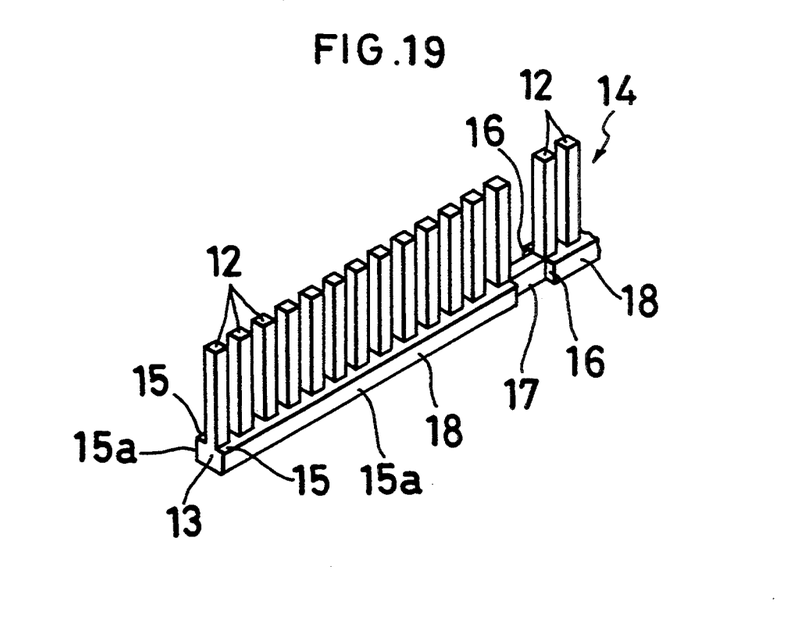

FIG. 18 shows a heat sink 20 according to a sixth embodiment of the invention, which similarly has no heat dissipating base plate 1 and which comprises an elongated comblike fin member 14. Cutouts 16, 16 are formed in spacer portions 15, 15 on the respective opposite sides of connector 13 of the fin member 14 at a predetermined spacing (see FIG. 19). The fin member 14 is bent at the connector portions 17 corresponding to the cutouts 16, 16 in the spacer portions 15, 15 to a zigzag form when seen from above. The zigzag fin member 14 has straight connector portions 18, 18 which are arranged in parallel as held spaced apart from one another by the spacer portions 15, 15 between adjacent portions 18, and opposes side faces 15a, 15a of spacer portions 15, 15 of the adjacent straight connector portions 18, 18 are joined to each other with a filler metal layer.

With the heat sinks 20 according to the fifth embodiment and sixth embodiment, the connector 13 of the fin member 14 has a thickness which is greater by an amount corresponding to the thickness of the base plate 1 which is absent to ensure an increased strength.

What is claimed is:

1. In a sink comprising a heat dissipating base plate and a plurality of comblike fin members formed separately from said base plate arranged in parallel at a predetermined spacing on one surface of the base plate in approximately perpendicular disposition with respect thereto, each of the fin members comprising pin-shaped fins arranged in a row and a connector connecting the fins together each at one end thereof, the invention comprising thermal bonds disposed between said connectors and said base plate surface and operative to structurally fix said fin members in mutually spaced, assembled relation.

2. A heat sink as defined in claim 1 wherein each of the comblike fin members includes an intermediate connecting portion extending between and connecting the fins of said fin member together each at an intermediate portion of the height thereof.

* * * * *